(12) United States Patent
Meliopoulos et al.

(10) Patent No.: US 6,265,881 B1
(45) Date of Patent: Jul. 24, 2001

(54) METHOD AND APPARATUS FOR MEASURING GROUND IMPEDANCE

(75) Inventors: Athanasios P. Meliopoulos, Atlantic, GA (US); George J. Cokkinides, Irmo, SC (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 08/270,406

(22) Filed: Jul. 5, 1994

Related U.S. Application Data

(63) Continuation of application No. 07/681,123, filed on Apr. 5, 1991.

(51) Int. Cl.⁷ .............................. G01R 27/08; G01V 3/02
(52) U.S. Cl. .................... 324/691; 324/347; 324/357; 324/713; 324/715; 324/718
(58) Field of Search .................... 324/715, 718, 324/354, 347, 357, 360, 361

(56) References Cited

U.S. PATENT DOCUMENTS

| | | | |
|---|---|---|---|
| 2,172,557 | * 9/1939 | Evjen | 324/354 |
| 4,041,372 | * 8/1977 | Miller | 324/357 |
| 4,209,741 | * 6/1980 | Coby et al. | 324/713 |
| 4,752,881 | * 6/1988 | Griffiths | 324/354 |
| 4,835,474 | * 5/1989 | Parra | 324/357 |
| 4,942,361 | * 7/1990 | Gast | 324/357 |

FOREIGN PATENT DOCUMENTS

| | | | |
|---|---|---|---|
| 1300777 | * 7/1964 | (FR) | 324/357 |
| 2603993 | * 3/1988 | (FR) | 324/509 |
| 0076960 | * 6/1980 | (JP) | 324/715 |
| 0149061 | * 11/1980 | (JP) | 324/715 |
| 0200974 | * 11/1984 | (JP) | 324/715 |

OTHER PUBLICATIONS

Zwicker, Messung des Erdungswidertandes, Dec. 1980, pp. 18–24.*

* cited by examiner

*Primary Examiner*—Vinh P. Nguyen
*Assistant Examiner*—Anjan K. Deb
(74) *Attorney, Agent, or Firm*—Troutman Sanders LLP; Todd Deveau, Esq.; Ryan A. Schneider, Esq.

(57) ABSTRACT

A method and apparatus for measuring impedance of grounding system wherein a transient electric current is injected at the ground system under test while measuring the a transient ground potential difference, as well as the injected electric current. The ground potential difference is measured with respect to several points on the earth's surface at small distances from the test system. These measurements are processed by computer software which filters noise, corrects voltage and current transducer errors, and estimates the test system ground potential rise with respect to remote earth.

Correction algorithms are used to remove irregularities in the frequency response of the voltage and current transducers and analog filters. The filtered and corrected measurements are used to estimate the ground impedance as a function of frequency. For this purpose, a parameter estimation procedure is used which takes into consideration the geometric arrangement of the voltage and current probes.

5 Claims, 15 Drawing Sheets

METHOD AND APPARATUS FOR MEASURING GROUND IMPEDANCE

This is a continuation of copending application Ser. No. 07/681,123 filed on Apr. 5, 1991.

TECHNICAL FIELD

The present invention relates to a method and apparatus for measuring the impedance of the ground of an electric power grounding system for evaluating the performance of the grounding system.

BACKGROUND OF THE INVENTION

Traditionally, the performance of electric power grounding systems has been evaluated by measuring the impedance of the grounding system using the so-called "fall of potential" method. In the fall of potential method, a reference electrode is placed in the ground at a location far removed from the grounding system. A current is applied to the grounding system and the voltage potential between the grounding system and the reference electrode is measured. This voltage potential is referred to in the art as the "ground potential rise" and the method assumes that this ground potential rise or "GPR" is a measurement of the voltage potential between the grounding system and the most remote earth. The GPR simply is divided by the current applied, according to Ohm's Law (V=IR), to determine the resistance of the grounding system. The resistance is assumed to be equal to the impedance, thus providing an estimation of the impedance.

This fall of potential method suffers badly from several deficiencies. For example, very long wires are needed to place the voltage probe as far from the grounding system as possible in an attempt to get clear of the zone of influence or electrical interference in the vicinity of the grounding system. Typically, these wires are 2–3 miles long and some are much longer. However, in order to completely avoid the interference from the grounding system itself, one would have to place the voltage probe at an infinite distance from the grounding system. Obviously, this is not possible. Also, as the length of the wire is increased, the reliability of the signal suffers due to voltage interference induced in the long wire by electric sources, such as power distribution lines, adjacent the wire. Furthermore, where grounding systems are placed in the vicinity of populated areas, the use of long wires is generally impractical owing to problems in securing a needed right-of-way.

By assuming that the measured voltage potential between the grounding system and the probe is equal to the voltage potential between the grounding system and the most remote earth, the fall of potential method introduces a significant error in the estimation of impedance. This is compounded by the simplistic approach used to estimate impedance without considering the reactance component of impedance.

It has been common in the practice of the fall of potential method to use a steady-state, alternating current source for providing the electric current injected into the ground through the grounding system. Unfortunately, such a current source produces currents very much like currents applied to the grounding system by the electric power system, making it difficult to distinguish a useful voltage signal from common noise. Finally, the above-described shortcomings of the fall of potential method render the method generally useless for very large grounding systems having very low impedances, because in extending the probe and the wire to beyond the zone of influence of the grounding system, the probe and the wire typically would end up either in the zone of influence of another grounding system or the interference from power circuits will corrupt the useful signal, or both, and because in this case the useful signal is relatively low, the method is virtually prevented from making an accurate measurement of low impedance values.

Accordingly, it can be seen that a need yet remains for a method and apparatus for measuring ground impedance which does not require long wires, which provides an accurate measurement, and which is effective for evaluating large grounding systems with low impedances. It is to the provision of such a method and apparatus that the present invention is primarily directed.

SUMMARY OF THE INVENTION

Briefly described, in a preferred form the invention comprises an apparatus for measuring ground impedance to evaluate the performance of an electric power grounding system. The apparatus comprises a current electrode for placement in the ground and means for causing an electric current to flow from the current electrode through the grounding system. At least two voltage probes are provided for placement in the ground at first and second locations spaced from the grounding system for detecting ground potential differences resulting from the flow of current from the current electrode through the grounding system. The voltage probes are placed rather close to the grounding system, on the order of hundreds of feet. Electronic means are provided for evaluating the ground potential differences as detected by the voltage probes at these first and second close locations to estimate a ground potential rise at remote earth. The estimated ground potential rise is used to calculate the impedance of the grounding system.

Preferably, the electronic means are adapted for controlling the electric current and are linked with a computer for processing data, while filtering noise. Also, the current is injected as a random, transient current.

In operation, the transient electric current is caused to flow from the current electrode to the grounding system and the resulting transient ground potential differences at the various voltage probes at several points on or below the earth surface at small distances from the grounding system are measured and recorded. After the signals have been filtered of noise, a parameter estimation procedure is used which takes into consideration the distance of the voltage probes from the grounding system. Specifically, the ground potential rise with respect to remote earth is estimated by comparing the measured data with grounding system mathematical models.

In another form, the present invention comprises a method for measuring ground impedance to evaluate the performance of a grounding system, the method comprising the steps of placing a current electrode in the ground and placing at least one voltage probe in the ground at a position spaced a short distance from the grounding system. The method also includes the steps of causing current to flow from the current electrode to the grounding system, detecting a ground potential difference with the voltage probe, and evaluating the ground potential difference in relation to the distance of the voltage probe from the grounding system to determine a ground potential rise with respect to remote earth, and using the ground potential rise of remote earth to calculate the impedance of the grounding system.

Accordingly, it is a primary object of the present invention to provide a method and apparatus for measuring ground impedance without requiring lengthy cables.

It is another object of the invention to provide a method and apparatus for measuring ground impedance which is suitable for use with a large grounding system with low impedance.

It is another object of the invention to provide a method and apparatus for accurately measuring ground impedance.

It is another object of the invention to provide a method and apparatus for measuring ground impedance and which is effective at filtering out extraneous noise, such as from adjacent power transmission lines.

Other objects, features and advantages of the invention will become apparent upon reading the following specification in conjunction with the accompanying drawing figures.

BRIEF DESCRIPTION OF THE DRAWING FIGURES

DETAILED DESCRIPTION

Figure 1:
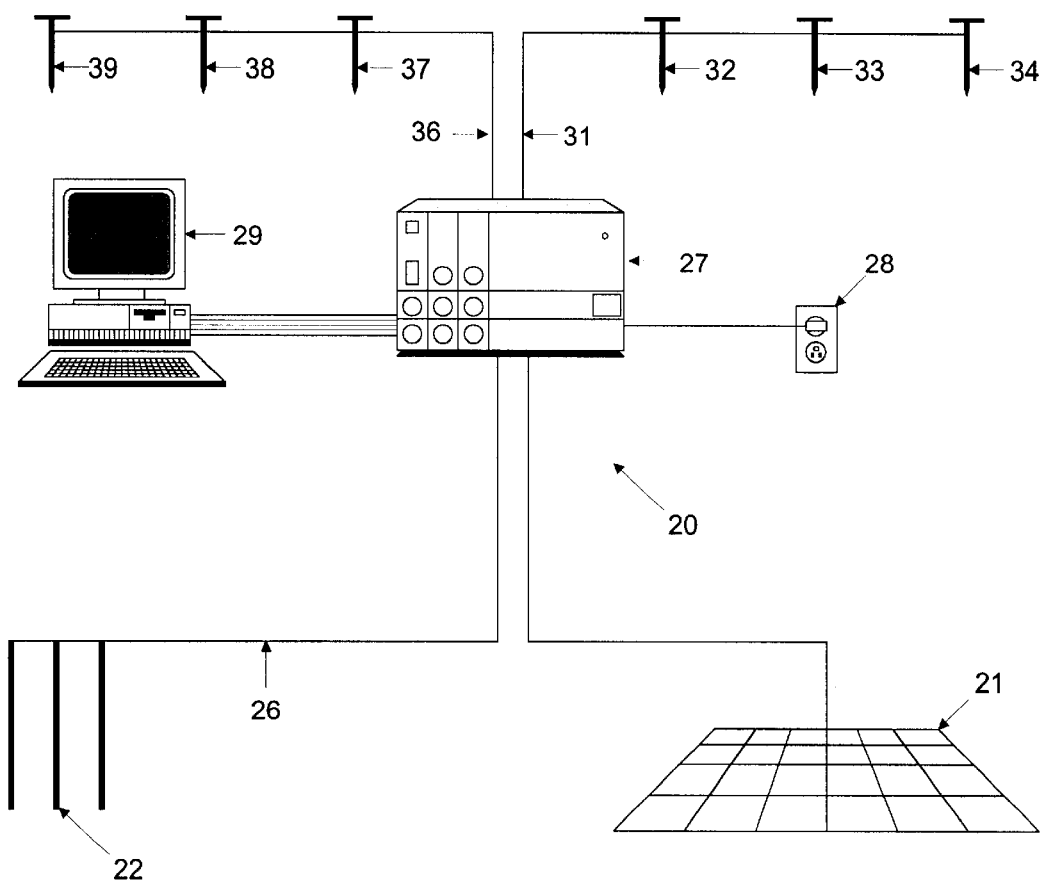
FIG. 1 is a schematic illustration of an apparatus for measuring ground impedance according to a preferred form of the invention.

Referring now in detail to the drawings figures, wherein like reference numerals represent like parts throughout the several views, FIG. 1 shows an apparatus 20 for measuring ground impedance of a grounding system 21 according to a preferred form of the invention. The apparatus 20 includes an electric current probe, such as multi-prong electrode 22, which is electrically coupled by an electrical cable 26 to an electronic console 27. Electronic console 27 is powered by a power source 28. The electronic console 27 includes an electric current source module and a signal acquisition and control module, which will be discussed in more detail below.

A computer 29 is coupled to the electronic console for recording and analyzing data collected therein. In an apparatus actually constructed and tested, an IBM P/S2 Model 80 personal computer was used.

A cable assembly 31 is coupled to the electronic console and links the electronic console with three voltage probes 32, 33 and 34. A similar cable assembly 36 also is associated with the electronic console and carries voltage probes 37, 38 and 39.

Figure 2:
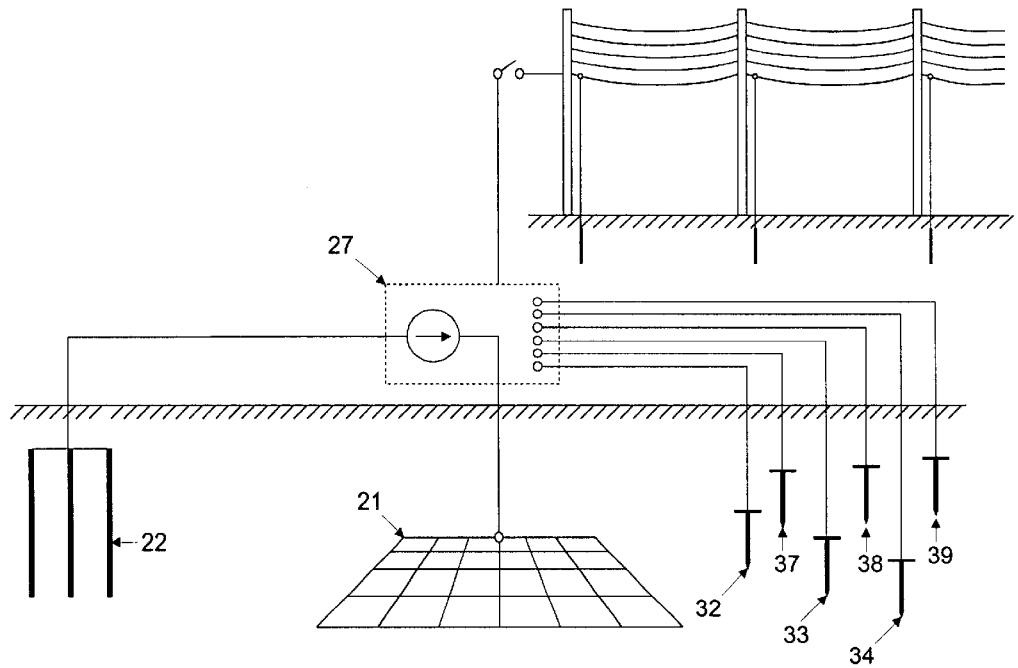
FIG. 2 is a schematic illustration of the apparatus of FIG. 1.

The grounding system 21 depicted in FIG. 1 and FIG. 2 typically consists of a large grid or mat of conductors embedded in the ground over an area of hundreds of square feet. Grounding systems generally range in size from tens of feet by tens of feet to thousands of feet by thousands of feet. The current electrode 22 can be placed in a convenient location in the ground generally in the vicinity of the grounding mat 21. On the other hand, the voltage electrodes, such as voltage electrodes 32–34 and 37–39, are placed in the ground spaced from the grounding system a short distance therefrom at known intervals along their respective cable assemblies 31 and 36. For example, as shown in FIG. 2, voltage probe 32 is positioned 250 feet from the grounding system 21, voltage probe 33 is positioned 125 feet farther out from voltage probe 32 and voltage probe 34 is positioned 125 feet farther out from voltage probe 33. The particular distance between any one voltage probe and another or between a voltage probe and the grounding system is not critical; rather, what is important is that the distances, both individually and collectively, can be relatively short in comparison with the long wires used in the fall of potential method to avoid the above-described problems associated with long wires. The short lengths of the wires are of the same order as the size of the grounding system, which typically is hundreds of feet across. Accordingly, the relatively short wires according to the present invention typically space the voltage probes on the order of hundreds of feet from each other and from the grounding system, rather than on the order of miles. Whatever the spacing between the voltage probes themselves or between the voltage probes and the grounding system, it is important that the algorithm used to estimate the ultimate ground potential rise at remote earth based on the ground potential differences as measured by these relatively closely spaced voltage probes is consistent with the actual spacing of the voltage probes.

Figure 4A:
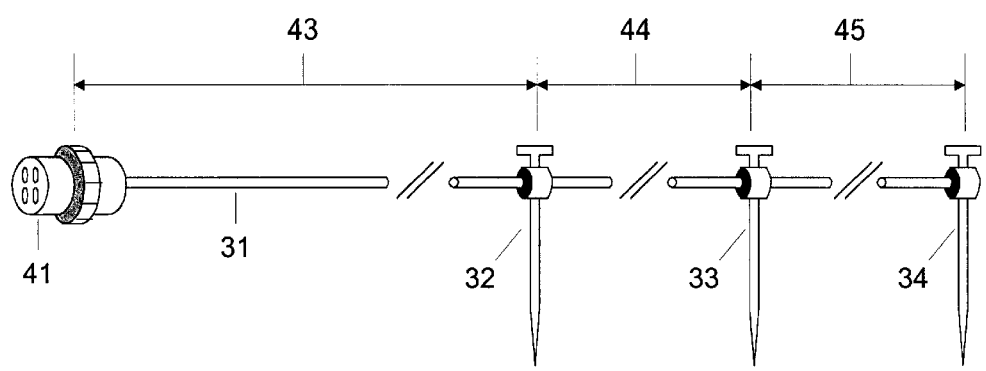
FIGS. 4A and 4B are perspective illustrations of portions of the apparatus of FIG. 1.

FIG. 4A shows a means for ensuring that the actual spacing and the anticipated spacing are in agreement. In FIG. 4A, cable assembly 31 is seen to include a connecting terminal 41 at one end thereof for connecting the cable assembly to electronic console 27. The cable assembly has an overall length from connector 41 to voltage probe 34 of approximately 500 feet, with voltage probe 32 being spaced a distance 43 of approximately 250 feet from the cable connector 41, voltage probe 33 being spaced a distance 44 of 125 feet from voltage probe 32, and voltage probe 34 being spaced a distance 45 of 125 feet from voltage probe 33. Cable assemblies having different overall lengths and different spacings between the individual voltage probes can be provided as desired. Preferably, at least two cable assemblies are provided, one with an overall length of 250 feet and the other with an overall length of about 500 feet or more. By having cable assemblies with two different ranges, the apparatus can be easily adapted to a particular local topographical situation.

Figure 4B:
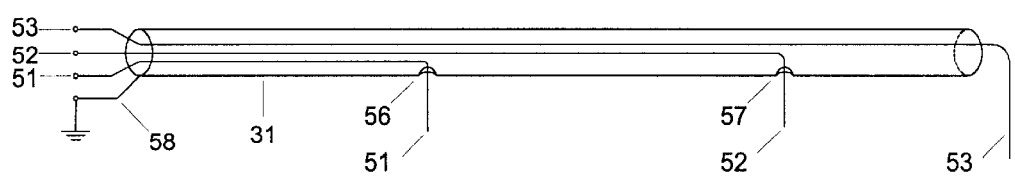

FIG. 4B shows that the cable assembly 31 is a coaxial cable including three shielded electric wires 51, 52 and 53. The electric wires 51, 52, and 53 are shielded within the coaxial cable and each exit the coaxial cable at intervals spaced according to the configuration shown in FIG. 4A. Cables 51 and 52 exit through apertures 56 and 57 formed in the coaxial shielding of cable 31. The shielding of coaxial cable 31 is connected to ground via electric cable 58. Insulation, in the form of insulating tape 76, is wrapped about the coaxial cable 31 adjacent each of the electric cables 51–53 to protect the apertures and the interior of the coaxial cable from weather.

Figure 5A:
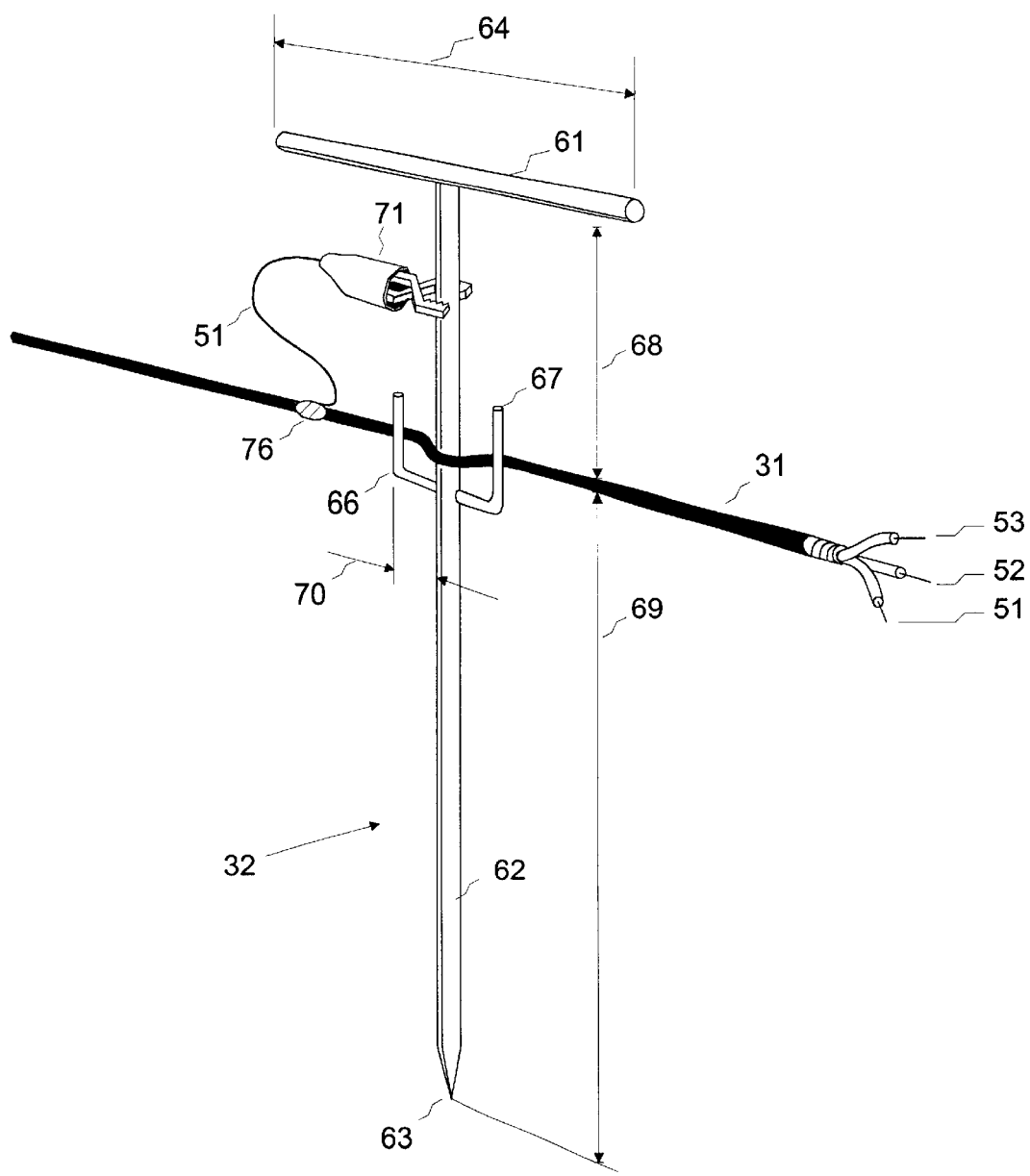
FIG. 5A is a perspective illustration of a portion of the apparatus of FIG. 4A.

FIG. 5A shows the construction of a voltage probe 32 and its connection to the cable assembly 31. The voltage probe 32 is a generally T-shaped spike having a transverse head 61 and an elongated shank 62 including a pointed end 63 for penetrating into the ground. Transverse head or handle 61 has a length 64 of approximately 6 inches and is made of steel rod having a ½ inch diameter and is useful for manually pushing the probe into the ground. Shank 62 also is made of ½ inch steel rod and is approximately 24 inches tall. An L-shaped bracket 66 and a second L-shaped bracket 67 are secured, as by weldments (unshown), to shank 62 and are positioned a distance 68 of 6 inches from handle 61 and are positioned a distance 69 of 18 inches from the end of pointed end or tip 63. L-shaped brackets 66 and 67 each include an upright portion spaced a distance 70 of approximately one inch from the surface of shank 62. Together, the L-shaped brackets 66 and 67 straddle the shank 62 of the voltage probe and allow coaxial cable to be threaded therein to secure the cable to the voltage probe. This arrangement provides a readily releasable and convenient attachment between the cable and the voltage probe. Electric wire 51 extends through an opening formed in the side of the coaxial cable assembly 31 (unshown in this drawing, see FIG. 4B) and is electrically coupled to the voltage probe by an electrically conducting clamping member 71, often referred to as an "alligator clip".

Figure 5B:
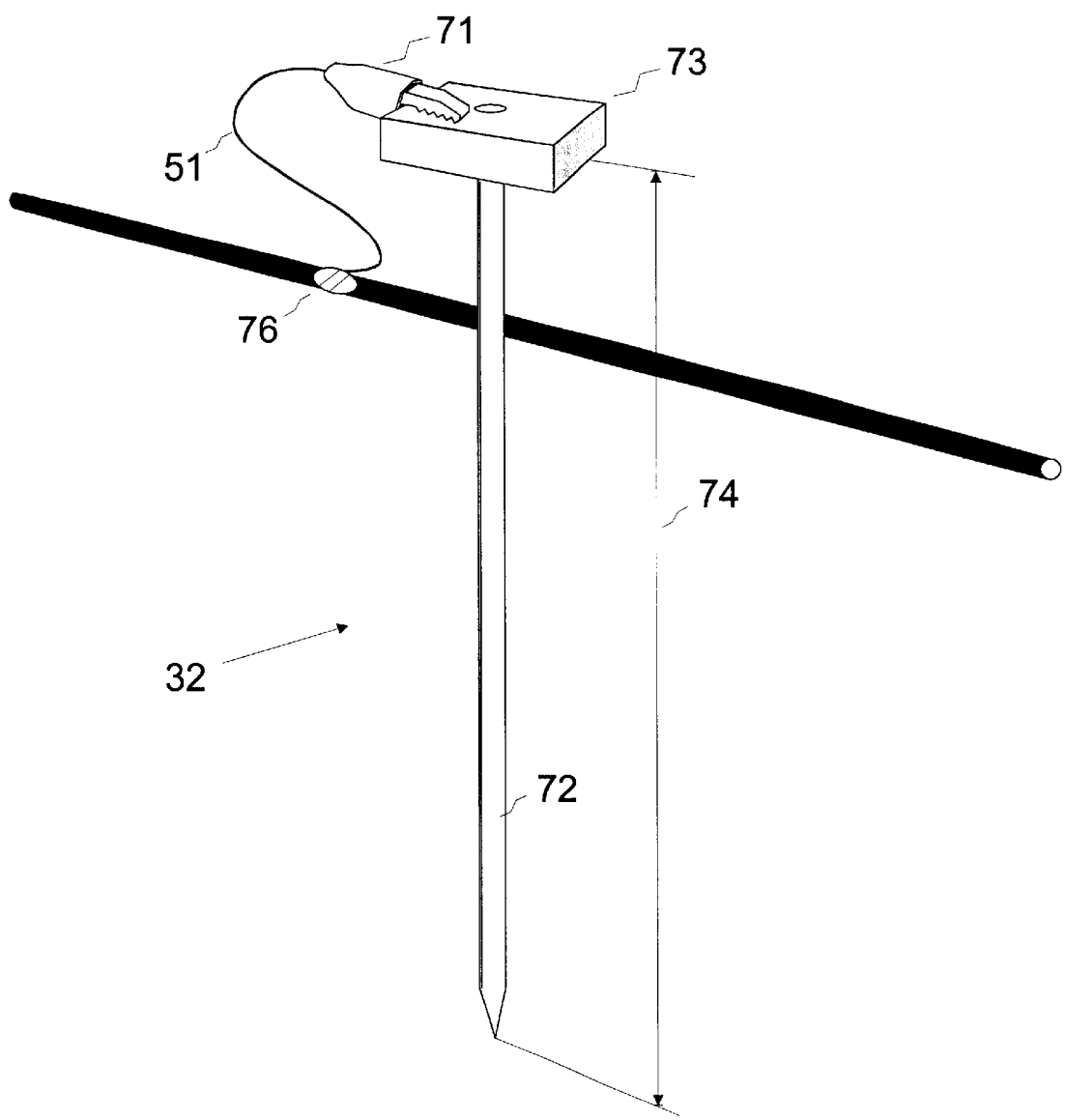
FIG. 5B is a perspective illustration of a portion of the apparatus of FIG. 4A in a modified form.

FIG. 5B shows an alternative arrangement for the voltage probe 32 in which the voltage probe includes a shank portion 72 and a head 73 secured thereto and adapted to receive blows from a hammer for driving the voltage probe into the ground. In this construction, the voltage probe is adapted for use in relatively hard soils and has a shorter overall length 74 of only 18 inches. As with the voltage probe shown in FIG. 5A, the voltage probe is electrically coupled with electric wire 51 by means of alligator clip 71.

Figure 6:
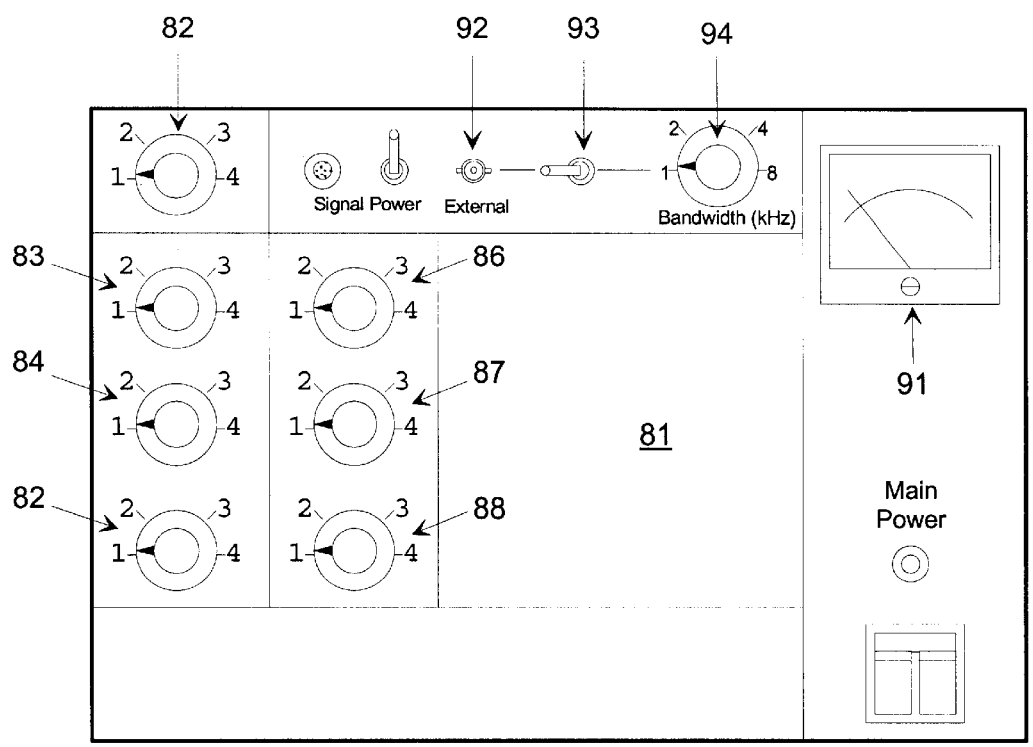
FIG. 6 is a front elevational view of an electronic console portion of the apparatus of FIG. 1.

FIG. 6 shows a front panel 81 of the electronic console 27. The front panel 81 has mounted thereon a selector knob 82 for varying the gain of the current supplied through current probe 22. Attenuator knobs 83–88 are provided for controlling the gain of signals received from the voltage probes 32–34 and 37–39. In the preferred form of the invention, gain knobs 82, 83, . . . , 88 are manually selected. In another form, the gains can be automatically selected by providing proper electronics and software. A meter 91 is mounted on the front panel for displaying the amplitude of the current being applied to the grounding system. A connector 92 is provided for using an external current source and a toggle switch 93 is provided for selecting between the external current source and the internal current source. A band width selector 94 is provided for selecting the frequency cutoff of the internal current source, as will be described in more detail below.

Figure 7:
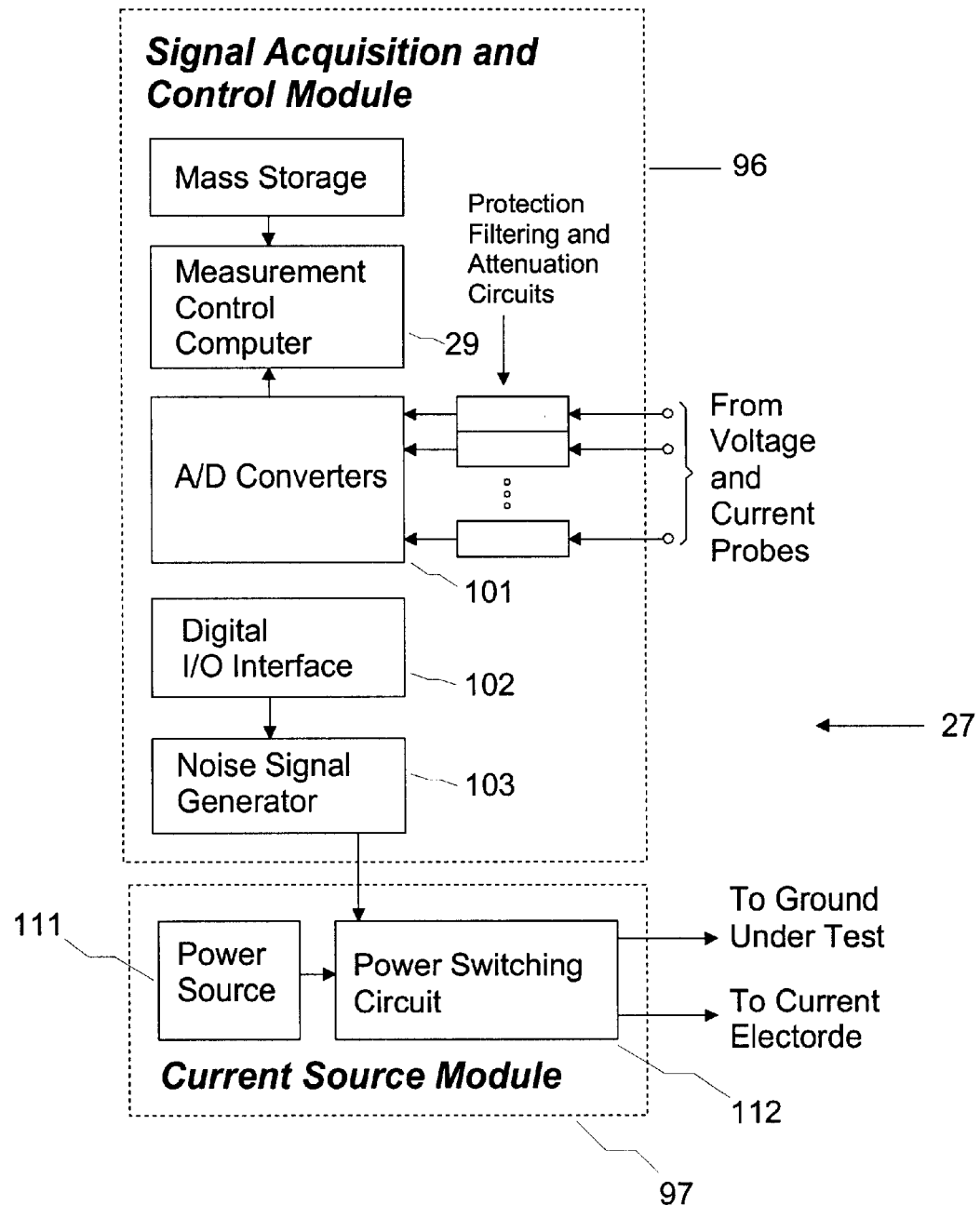
FIG. 7 is a functional, schematic illustration of the electronic console of FIG. 6.

As shown in FIG. 7, the electronic console 27 houses a signal acquisition and control module 96 and a current source module 97. The signal acquisition and control module 96 processes the signals from the six voltage probes 32–34, 37–39 and one current probe 22. These signals are first scaled down to proper levels for electronic instrumentation. Next, they are filtered with a low pass filter to remove all noise above the frequency range of interest (e.g., 1 kHz). Next, the signals are sampled and digitized by A/D converters 101. Finally, they are stored on a floppy disk for later processing by signal processing and ground impedance computation software.

The data acquisition and storage is controlled by the external measurement computer 29. In addition, computer 29 continuously monitors the measurement signals and warns the operator if inappropriate signals are detected. Specifically, the computer ensures that the level of the measured signals is within an optimal range for best signal-to-noise ratio without overloading the signal processing components.

The electric current source module 97 consists of a power source 111 (220 Volts) and power switching electronics 112. The switching signals are received from the signal acquisition module. When the signal is on, an electric current is circulated between the ground system 21 under test and the electric current electrode 22. A current probe (unshown) measures the circulating electric current. The measurement of the electric current is brought into the signal acquisition module. In addition, the ground potential differences between the ground system under test and the several voltage probes located around and at distances from the ground system are measured and brought into the signal acquisition module.

The above measurement procedure is performed for a period of 5 seconds. The collected data are stored in mass storage for subsequent processing by the impedance computation software.

The objective of the signal acquisition and control module is: (1) to acquire data from the six voltage probes and one current probe; (2) to store the data in digital format for processing; (3) to examine all measured signals and issue diagnostics instructions in case the signals are not in the proper range; and (4) to issue signals for the control of the electric current source module. FIG. 7 shows the signal acquisition and control module 96 in block diagram form.

The voltage signals at each of the six voltage probes are measured with respect to the potential of the grounding system under test. The injected current is measured using a current transformer connected at the output of the current source. This transformer is located inside the current source module and will be discussed in more detail below.

Figure 8A:
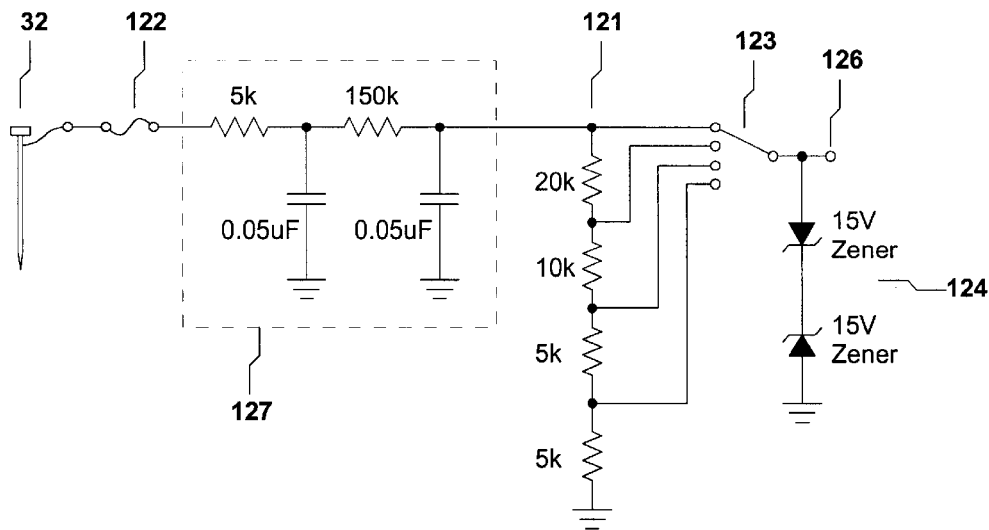
FIGS. 8A and 8B are schematic electrical diagrams of voltage probe and current probe input circuits of the electronic console of FIG. 6.

As shown in FIG. 8A, the voltage probe signals first are each passed through low pass filters, such as that shown in circuit 121. The circuit shown filters out spikes that can damage the signal processing electronics. Also, this filter circuit attenuates frequency components above the frequency range of interest so that aliasing does not occur when the signals are digitized.

A passive R-C low pass filter approach 127 is selected for its simplicity and ruggedness. The filter cutoff (−3 dB) frequency is at approximately 500 Hz. Beyond that frequency, the response decays at the rate of 12 dB per Octave. A fast blow fuse 122, preferably 60 mA rating, is connected in series with the low pass filter input to provide protection against severe overvoltages (above 500 Volts).

The low pass filter 127 is followed by an attenuator 123. The function of the attenuator is to keep the measured signals within the range of the A/D converters, and also to take advantage of the A/D converter's dynamic range. Specifically, the attenuator 123 is adjusted for a maximum level that does not overload the A/D converter. It allows the attenuation levels of 1/5, 1/10, 1/20, and 1/40 of the input signals. Attenuator 123 is controlled by its respective attenuator knob (knobs 83–88 shown in FIG. 6).

A zener diode pair 124 is connected across the output of the attenuator 123 to limit the output voltage within +/−14 Volts peak. This protects the input of the A/D converter 101 which is connected at the attenuator output 126. The low pass circuit shown in FIG. 8A is repeated six times, once for each voltage probe.

Figure 8B:
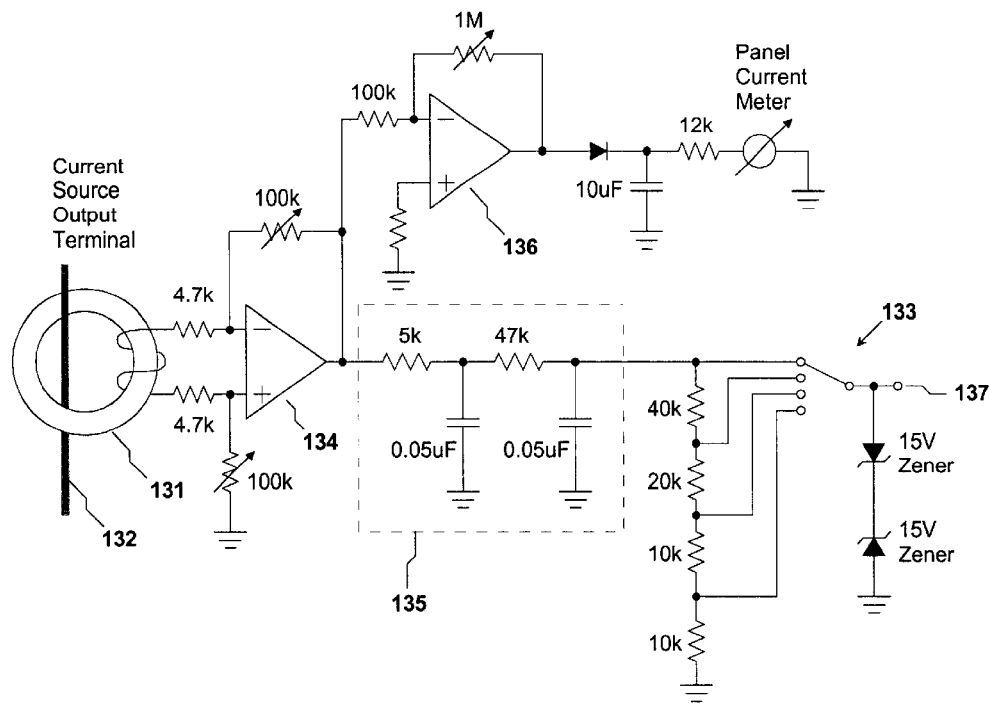

The current input circuit is shown in FIG. 8B. The current signal is obtained from a current transformer 131 connected at the output 132 of the current source. A Pearson current transformer is used, preferably rated at 700 kHz, 150 A max. This transformer has an internal resistive shunt which yields a transformation ratio of 0.02 Volts/Amp. The resulting output voltage is thus very low and must be amplified. A differential amplifier is used based on a dual 741 op-amp. The output of the first op-amp 134 is connected to a passive low-pass filter 135 and attenuator 133 similar to those for the voltage probe input circuits. The second op-amp 136 in the input current circuit is used to drive current meter 91 located on the front panel of the current source enclosure.

The output 126, 137 of each attenuator 123, 133 is connected to the input of analog-to-digital converter 101. The Metrabyte Model WCDAS-16G has been selected for this purpose. This adapter card has the following specifications:

16 input channels,
Sampling rate: 70 k samples/sec,
Precision: 12 bits,
IBM PS/2 Microchannel compatible.

This board is installed directly on the measurement control computer bus, thus allowing fast data throughput.

An IBM PS/2 Model 80 is used as the measurement control computer 29. It obtains the digitized voltage and current signals from the A/D converters 101 and stores them on disk. It checks the signals to see if they are within the proper range and if otherwise it warns the operator.

The objective of the electric current source module 97 is to inject a current into the grounding system under test. The current source is connected between the ground system under test and a set of ground rods (the current electrode 22) several hundred feet away from the tested ground. The injected electric current waveform is pseudorandom noise spanning the frequency range of interest (e.g., 0 to 1 kHz). The electric current level must be large enough so that the resulting ground potential difference is well above background noise. Preliminary analysis has shown that an electric current level of about 10 amperes is necessary and that voltage developed by the source must be at least 200 V.

Figure 9A:
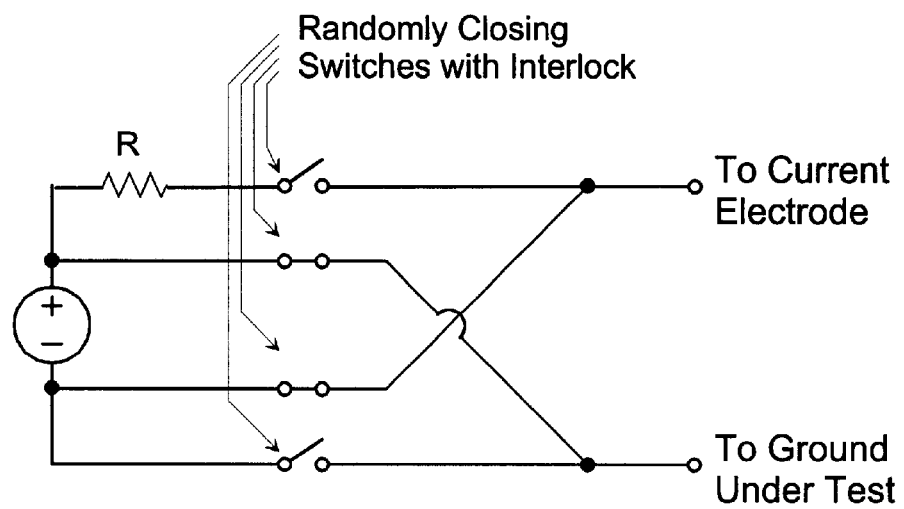
FIG. 9A is a schematic electrical diagram of a current generation-scheme of the apparatus of FIG. 6.
Figure 9B:
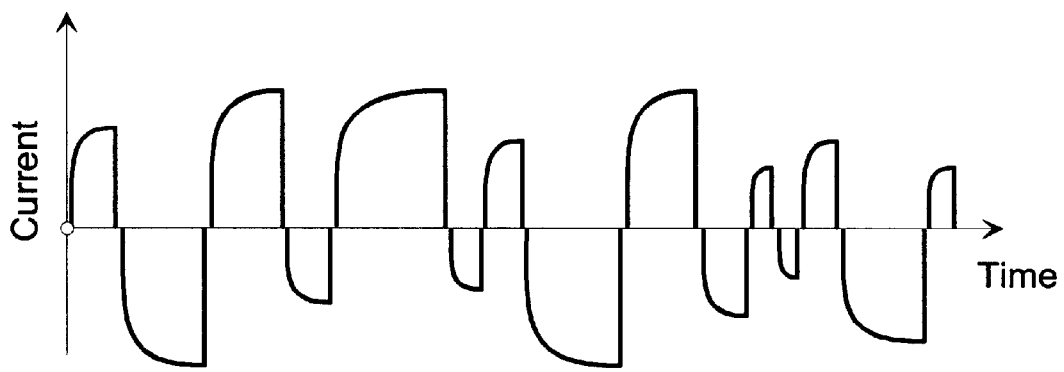
FIG. 9B is a graph of current waveform generated with the scheme of FIG. 9A as a function of time.
Figure 9C:
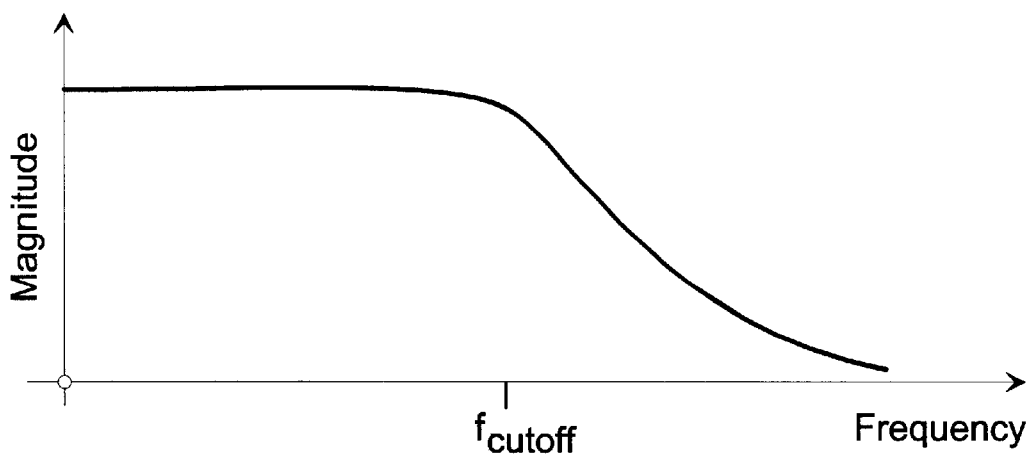
FIG. 9C is a graph of current spectrum generated with the scheme of FIG. 9A as a function of frequency.
Figure 10:
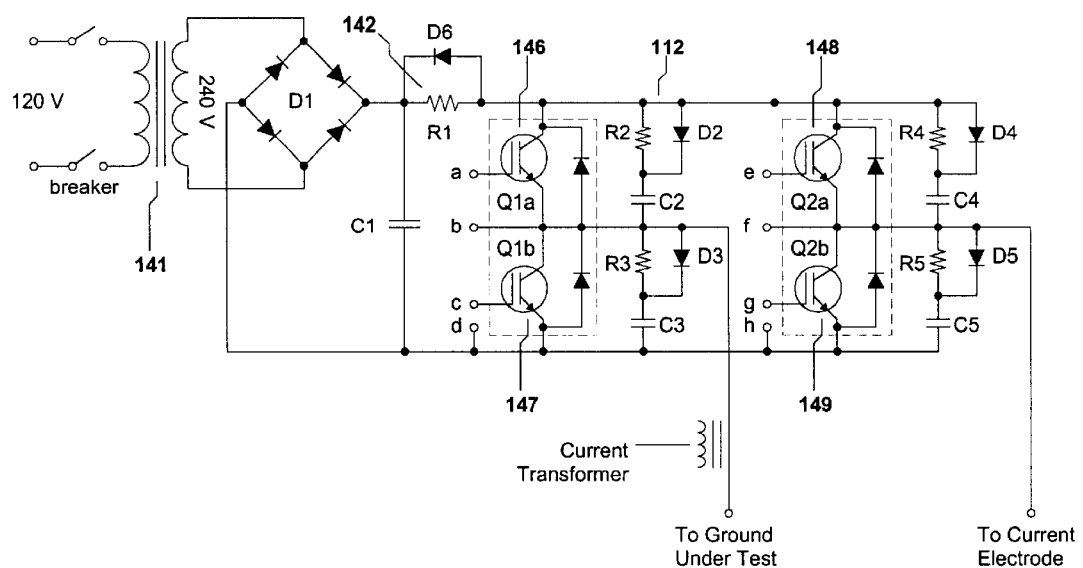
FIG. 10 is a schematic electrical diagram of a current source circuit portion of the apparatus of FIG. 6.
Figure 11:
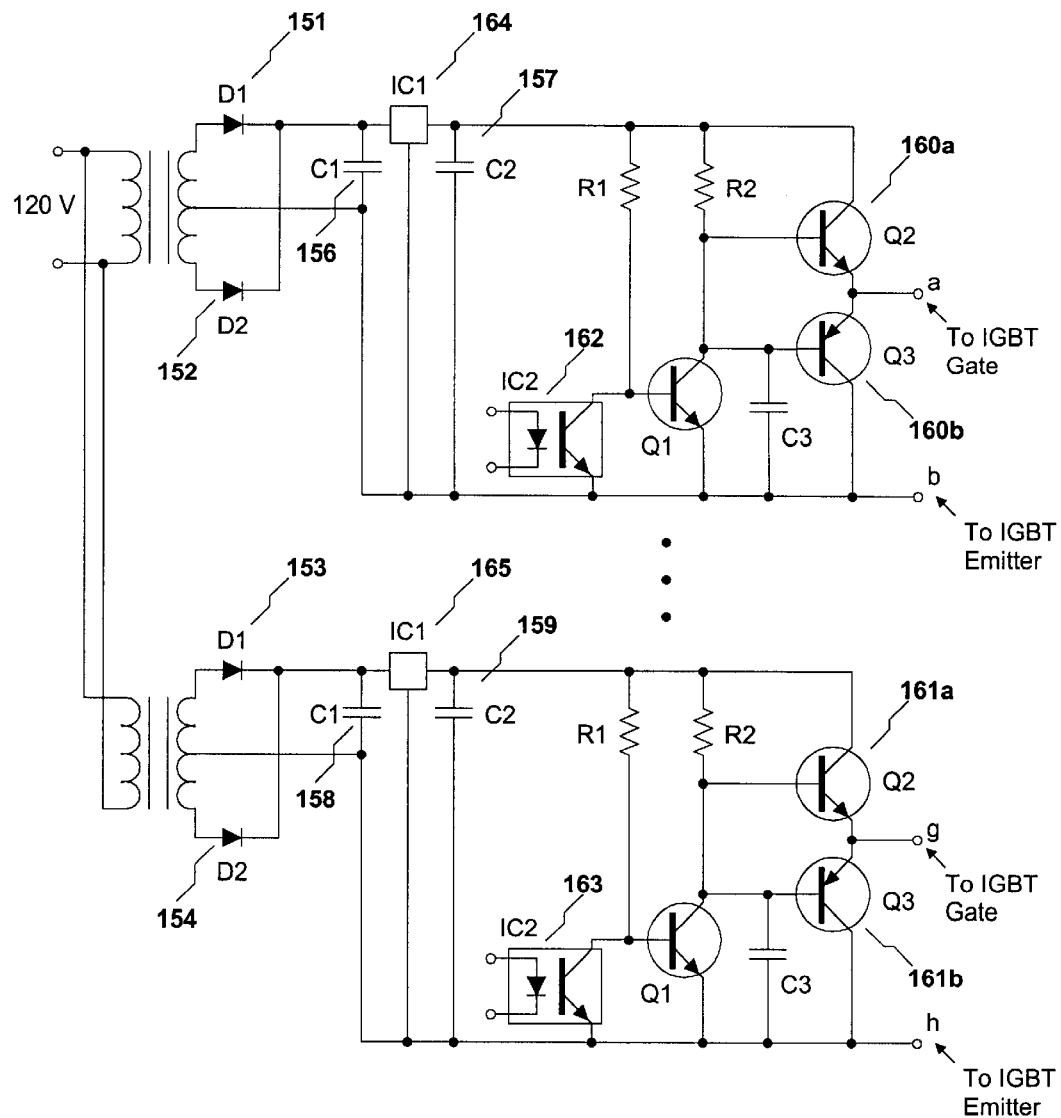
FIG. 11 is a schematic electrical diagram of a driver circuit portion of the apparatus of FIG. 6 for driving the current source circuit of FIG. 10.
Figure 12:
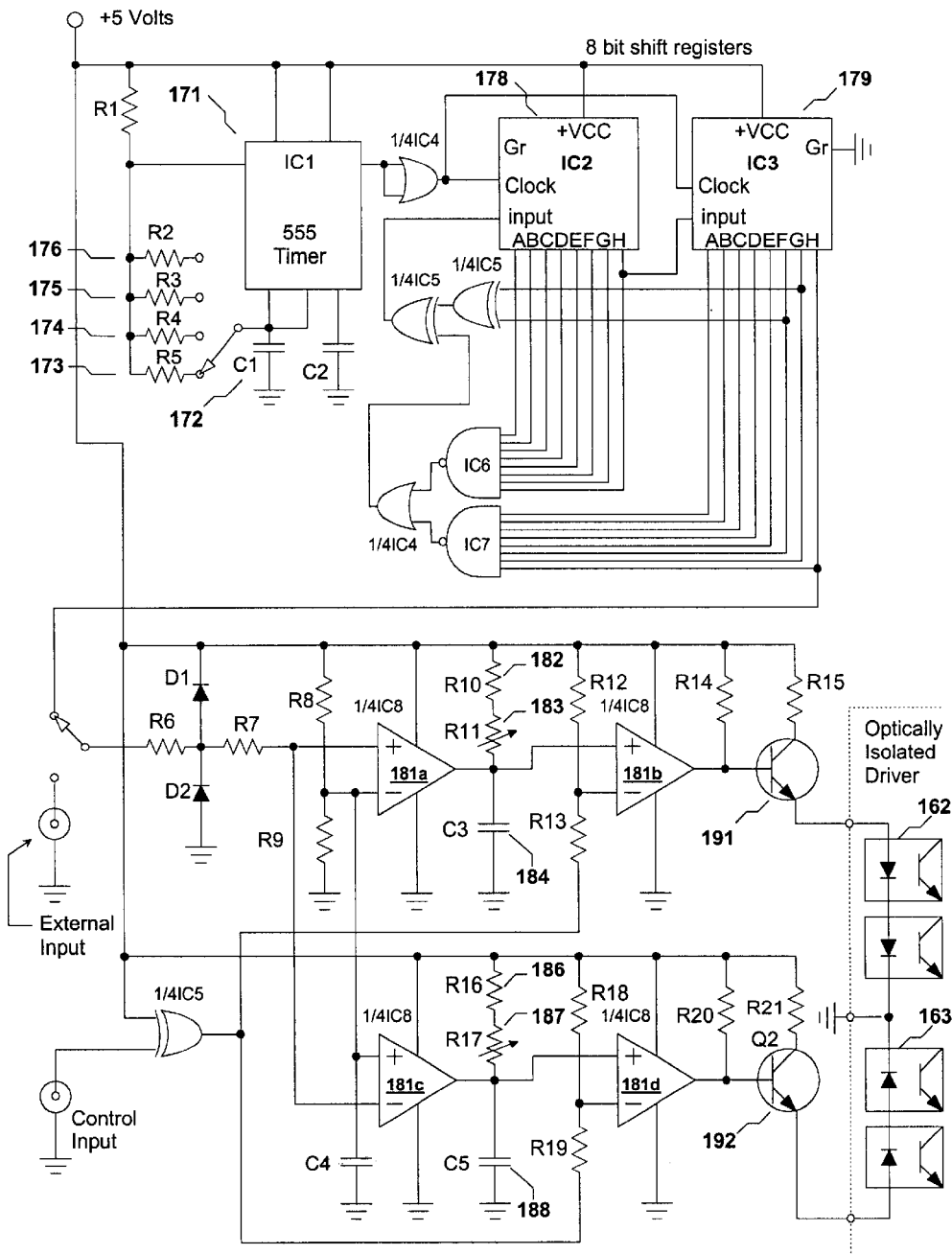
FIG. 12 is a schematic electrical diagram of a pseudo-random noise source circuit portion of the apparatus of FIG. 6 for the driver circuit of FIG. 11.

The scheme for generating the needed electric current described above is illustrated in FIGS. 9A–9C, and the means for generating the current source is illustrated in FIGS. 10, 11 and 12. Consider a voltage source connected to the grounding system through a resistor R and two switch pairs with interlock as shown in FIG. 9A. When the switch pairs are closed repetitively at random intervals, the electric current waveform of FIG. 9B flows through the grounding system. The spectrum of this waveform is shown in FIG. 9C. The spectrum spans a frequency range with a cutoff frequency determined by the maximum switching speed.

The circuit for the implementation of the current source is illustrated in FIG. 10. The power is obtained from 110 V AC supply 111. An isolation transformer 141, preferably rated at 1 kVA, is used to isolate the current source output from the power supply circuit. The resistance value of current-limiting resistor 142 is automatically adjusted via a feedback loop to ensure that the signal detected at the voltage probes is sufficiently greater than background noise to allow effective evaluation of the signal. Also, the current source circuit is not grounded to the power supply, but rather it can be grounded to the grounding system, thereby allowing the current source circuit to "float" in voltage. The output of the isolation transformer is rectified, and applied to an inverter bridge consisting of 4 Insulated Gate Bipolar Junction Transistors (IGBTs) 146–149, preferably rated at 1000 V, 50A. These transistors are based on new technology that yields devices capable of switching high voltages and currents. A resistor bank is placed in series with the IGBT bridge to limit the total output current in case the output is short-circuited. The IGBT circuit forms a part of the power switching circuit 112. The remainder of the power switching circuit is shown in FIG. 11. The current delivered from the circuit of FIG. 10 is both random and reversible. Reversing the current allows the apparatus to compensate for polarity in the soil.

FIG. 11 illustrates two of four identical gate driver circuits for the IGBTS. The two circuits shown connect to input points a, b, g and h in FIG. 10. Two additional identical circuits (not shown) connect to input points c, d, e, and f in FIG. 10. The purposes of the driver circuits are to:
1. Charge and discharge the gate capacitances of the IGBTs with sufficiently short switching times.
2. Provide a low impedance between gate and emitter of the IGBTs to prevent accidental misfiring.
3. Provide isolation between the IGBTs and the signal acquisition and control module.

The circuit shown in FIG. 11 meets the above objectives. The gates of the IGBTs are driven by complementary push-pull transistor amplifiers 160*a,b* and 161*a,b*. It provides fast switching and low output impedance. The input of each amplifier is driven via an optical isolator 162, 163 (2N35) consisting of a light emitting diode/phototransistor package. This scheme provides up to 3000 V isolation between the gate drivers and the signal acquisition and control module. To facilitate the isolation scheme, each gate driver is fed by a separate DC power supply consisting of a full wave rectifier, such as rectifiers 151–154, filter capacitors, such as capacitors 156–159, and an integrated circuit voltage regulator 164, 165, preferably rated at 12 V, 1.5A.

The input signal to the IGBT driver circuit is provided by a pseudo-random noise source 103 illustrated in FIG. 12. This circuit generates a square wave with randomly varying duty cycle and frequency. The spectrum of the resulting signal approximates white noise.

The circuit operates as follows. A clock signal is generated by a 555 timer chip 171 connected as an astable multivibrator. The clock (cut-off) frequency depends on the time constant of capacitor 172 and resistors 173–176. Four different cut-off frequencies (1, 2, 4, and 8 kHz) can be selected by front panel rotary switch 94. It is important that the cut-off frequency be much greater than 60 hertz to avoid errors caused by noise at that power delivery frequency and its harmonics.

The clock signal drives a pair of 8-bit shift registers 178, 179 which are connected in cascade. The input of the first shift register 178 is derived as the exclusive OR function of the sixth and seventh bit of the second shift register. This scheme generates a sequence of logic ones and zeros at the shift register outputs. This sequence repeats after a large number of clock cycles (on the order of $2^{14}$). An equal number of logic ones and zeros appears over a complete sequence period. Because of the relatively large sequence period, the ones and zeros appear to be randomly distributed.

The waveform representing this sequence is obtained at the eighth bit H of the second shift register 179. It is a square wave whose pulse width is pseudo-random. The spectrum of this waveform extends from almost DC to the clock frequency (at the clock frequency, the spectrum drops to zero).

The random noise signal is processed by a wave shaping circuit based on four comparators 181*a–d*. This circuit provides a small delay during turning on of each IGBT. The delay is determined by the time constant of the resistors 182 and 183 with capacitor 184 and resistors 186 and 187 with capacitor 188. The output of the comparators are open collector type, and thus the delay occurs only during the charging of capacitors 184 and 188. This scheme ensures that IGBTs belonging to the same pole will not conduct simultaneously thus shorting the power supply. The outputs of the comparators, boosted by transistors 191 and 192, are driving the light emitting diodes of the optical isolators 162, 163 of the IGBT driver circuit shown in FIG. 11.

The use of a random noise current generation scheme provides a large number of data points in a short length of time. The large number of data increases the reliability of the ultimate impedance measurement by preventing a small number of noise sources from greatly affecting the reliability and accuracy of the measured impedance.

Having now described the electronics hardware, attention is now directed to the software used to control the apparatus. The software is installed in a personal computer which controls the measurement process in the field, processes the data and displays the results. The software has been developed for an IBM P/S 2 Model 80 personal computer and the digital I/O interface 102, preferably a Metrabyte DASG16 Interface Card. It is an interactive command driven program consisting of the following components:

A user interface;

Measurement data collection algorithm;

Error correction algorithm;

Calibration Algorithm; and

The ground impedance estimation algorithm.

The user interface performs the following functions:

Inspect and modify measurement parameters;

Initiate Measurements;

Generate warning messages about improper use of smart meter; and

Generate reports of intermediate and final results.

The measurement data collection software controls the A/D converter of the METRABYTE DASG-16 Interface card, and stores the collected data in a database. Specifically, the following functions are performed:

1. A/D initialization and setup. This function sets the following sampling parameters:
   A. Selection of A/D converter sampling rate;
   B. Selection of number of channels and corresponding gains; and
   C. Selection of number of samples to be collected per channel.

The sampling rate and the number of samples to be collected per channel are adjustable via a user interface prompt. The number of channels is set to 7, one for the current probe signal and 6 for the voltage probe signals.

2. Initiation of data acquisition. This function initiates the collection of the data on all selected channels simultaneously. The data are stored in coded format directly in the PC memory (DMA mode of operation).

3. Polling A/D board to check if measurement is completed.

4. Writing to the digital output lines. This function is used to turn on and off the current source.

5. Retrieval and decoding of measured data stored in the PC memory during the data acquisition process.

The implementation of the above functions (1–5) is achieved via eight FORTRAN callable assembly language routines.

Figure 13:
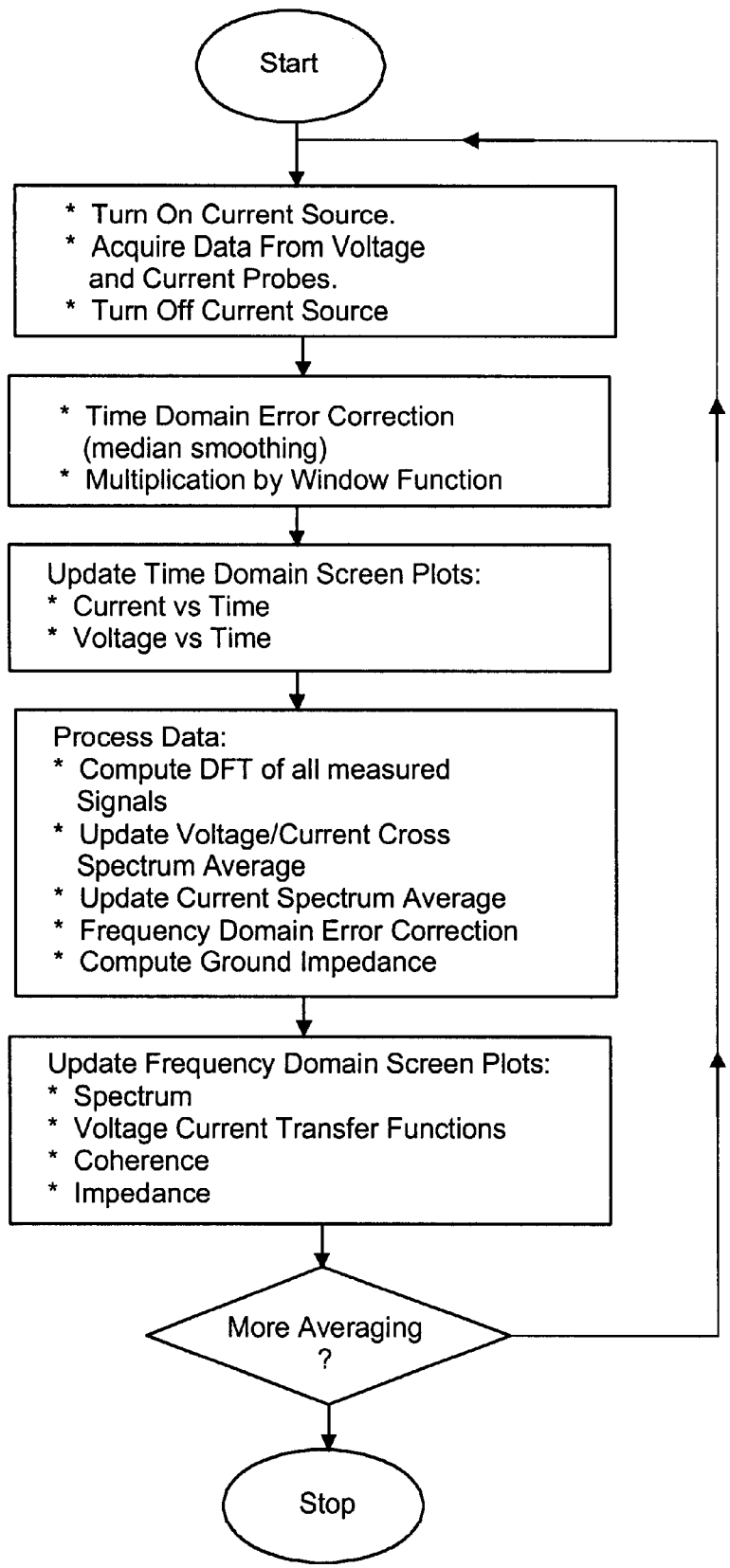
FIG. 13 is a schematic logic diagram depicting an algorithm used by the electronic console in controlling the apparatus of FIG. 1.
Figure 14:
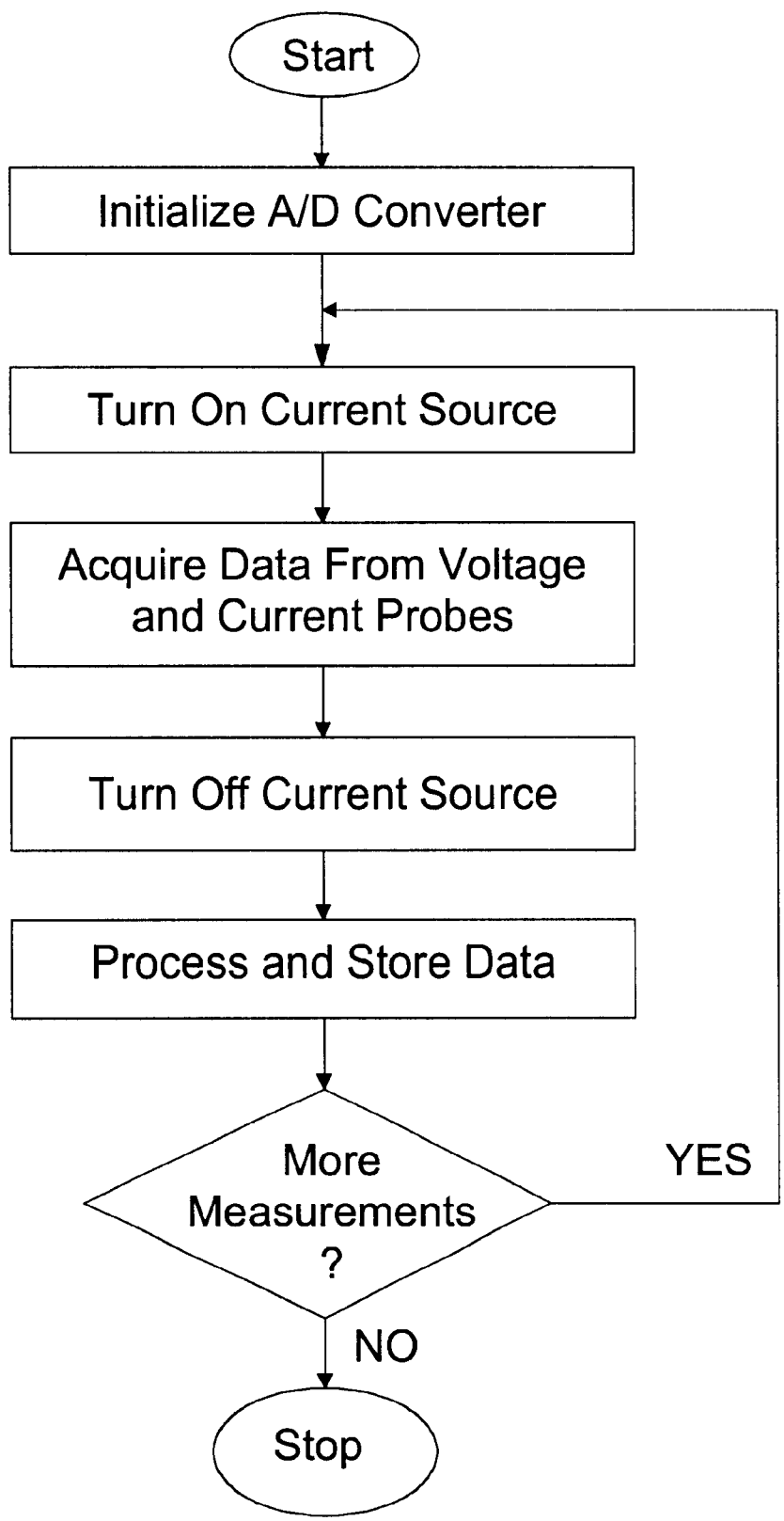
FIG. 14 is a schematic logic diagram depicting a data acquisition algorithm used by the apparatus of FIG. 1.

As shown in FIGS. 13 and 14, the measured voltage and current waveform data are processed by error correction algorithms to correct for the following sources of error:

1. Transient noise interference due to switching supply of current source;
2. 60 Hz and Harmonic noise induced from power system current; and
3. Transducer and antialiasing filter frequency response fluctuations.

Transient noise interference due to switching power electronics is minimized by appropriate hardware methods (i.e. shielding and isolation of the power circuits from measurement circuits). However, a small amount of very high frequency noise remains present. This noise appears as very short duration spikes added to the measured waveforms. Upon discretization, the number of these spikes that have an effect on the measured waveforms is reduced because the sampling process misses most of them. However, even if one of these spikes occurs within a sampling interval it can cause considerable error since its amplitude can be very large.

To correct this problem, the sampled data are filtered using the median smoothing algorithm. This algorithm operates as follows: Each sample of each measured waveform is replaced by the median value of the set of samples consisting of itself and an even number of neighboring samples. The median value of the set is defined as the value of the sample that ends up in the middle after sorting the samples of the set in increasing order. The total number of samples used to compute the median is called the order of the median smoothing. For this application it was experimentally shown that median smoothing of order 3 is sufficient to completely remove this type of interference.

Errors from 60 Hz and harmonic noise interference are reduced with a method based on cross-spectral averaging. This algorithm is integrated with the transfer function computation.

In spite of the cross-spectral averaging techniques for the reduction of external noise signals, when measuring the impedance of an energized substation grounding system, the presence of 60 Hz currents causes large errors in the computation of the impedance near 60 Hz and 60 Hz harmonics. These errors appear as spikes added on the otherwise smooth impedance versus frequency curve. These spikes are removed using the coherence function and a linear interpolation scheme. The coherence function is used in order to detect which portions of the impedance versus frequency curve contain a large error. Then these portions are replaced by linear interpolation.

The transducer and antialiasing filter frequency response is corrected by dividing the Fourier transforms of the measured waveforms by the transfer function of the corresponding combined transducer/filter response. The transfer functions of the transducer/filter system corresponding to each input of the apparatus are obtained using the calibration process described below.

The calibration algorithm corrects for all errors related to the magnitude and phase fluctuations and time delays associated with the data collection hardware. Specifically, the following sources of error are corrected using the calibration process:

1. Current transformer frequency response;
2. Input protection circuit frequency response;
3. Antialiasing filter circuit frequency response;
4. A/D converter input gain errors; and
5. Delays introduced due to sample and hold operation. (These delays differ from channel to channel since the channel sampling is sequential)

Figure 15:
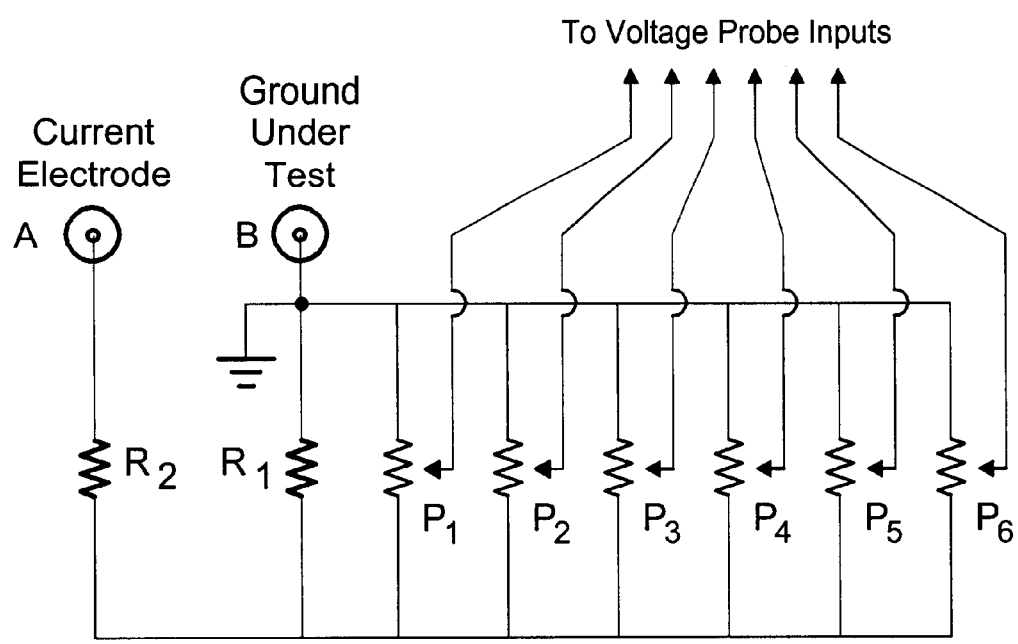
FIG. 15 is a schematic electrical diagram of a calibration circuit for use with the apparatus of FIG. 1.

The calibration circuit shown in FIG. 15 is connected to the current source output and the voltage probe inputs. This circuit simulates a specific grounding system of known resistance and geometry. The voltage probe signals are also represented. The circuit is constructed from low inductance, high precision resistors. Thus, the exact transfer functions between the injected current and voltage outputs are easily computed. Since the calibration circuit contains only resistors, the transfer functions are constant with respect to frequency and have zero phase.

The calibration algorithm automatically sets up the proper measurement control parameters, system parameters, and weight factors for the computation of the system resistance. The transfer functions between the voltage probes and current probes are computed from the measurements and then divided by the corresponding exact transfer functions. The resulting transfer function ratios are stored as a look-up table and used as correction functions during actual measurements. Specifically, during actual measurements, the measured transfer function for each voltage probe is divided by the corresponding stored correction function. Since the transfer functions are manipulated in complex form, both magnitude and phase/time delay errors are corrected.

The methodology used for the computation of the grounding system impedance versus frequency from the measured data is described below. The grounding system impedance is defined as follows:

$$Z(\omega) = \frac{GPR(\omega)}{I(\omega)} \quad \text{(Equation 1)}$$

Where: GPR is the ground potential rise of the grounding system under test, with respect to remote earth, due to the injected current.

The injected current $I(\omega)$ is computed as the Fourier transform of the direct measurement of the injected current waveform. However, the computation of the ground potential rise is not straightforward, since direct measurement of the remote earth potential is impractical as described above. The apparatus measures ground potential differences between the grounding system under test and each of the voltage probe locations. In order to estimate the ground potential rise of the grounding system under test from the ground potential difference measurements, a model of the grounding system is assumed. An estimation technique is used to fit the measured data to the model and compute the GPR with respect to remote earth. This methodology is described in detail next.

During the data acquisition process, the apparatus injects a pseudorandom current waveform into the grounding system under test. The resulting voltage waveforms at six locations (in the area surrounding the grounding system) are measured with respect to the grounding system voltage. These voltage waveforms, as well as the injected current waveform, are sampled and stored.

The waveform sampling is organized as follows: The current source of the apparatus is turned on and the six voltage probes and the current probe are simultaneously sampled with a constant sampling rate, and stored directly in random access memory. Once $N_s$ samples are accumulated from each probe, the sampling process is halted and the current source is turned off. Each such set of $N_s$ samples are referred to as a data block. The collected data blocks are then processed. The processing involves: error correction, Fourier transformation, cross-spectrum averaging, and estimation of the system impedance. In addition, the computer screen is updated with the latest data. The process is repeated for a number of times which is specified by the user for the purpose of averaging. Note that each data block contains continuously sampled data. However, there are small sampling gaps between consecutive blocks due to the time required for processing.

Let $I_j$ be the jth block of measured injected current samples, and $V_j$ the vector of a single block of measured ground potential difference (GPD) samples. Then:

$$V_j = \begin{bmatrix} V_{1j} \\ V_{2j} \\ V_{3j} \\ V_{4j} \\ V_{5j} \\ V_{6j} \end{bmatrix} \quad \text{(Equation 2)}$$

where: Each entry $V_{ij}$ represents a sequence of ground potential difference (GPD) samples obtained from voltage probe i, and j denotes the block number.

From these data, the grounding system impedance as a function of frequency is computed according to an estimation procedure, which can be summarized as follows:

1) Compute the transfer function of each ground potential difference (GPD) signal with respect to the injected current signal;
2) Estimate the grounding system potential rise transfer function with respect to the injected current. The grounding system potential rise is defined as potential rise with respect to remote earth. This quantity represents the grounding system impedance as a function of frequency as in Equation 1.

The ith GPD transfer function $H_i(\omega)$ (corresponding to voltage probe i) is defined as follows:

$$H_i(\omega) = \frac{V_i(\omega)}{I(\omega)} \quad \text{(Equation 3)}$$

where:

$V_i(\omega)$ is the Fourier transform of the ith GPD signal and $I(\omega)$ is the Fourier transform of the injected current signal.

The following limitations are imposed by the measurement procedure:

1. The voltage and current signals are discrete in time and truncated; and
2. The voltage measurements can be corrupted with noise signals due to sources other than the injected currents (for example 60 Hz signals plus harmonics from power system currents).

These problems are solved by using a time domain window function and the cross-spectrum averaging technique for the computation of $H_i(\omega)$. Specifically, the time domain voltage and current signals are multiplied by a window function such as the Hanning or Blackman window. These functions decay smoothly to zero near the edges of the tune window, thus minimizing effects of signal truncation. Next, the voltage and current signals are transformed into the frequency domain using the Fast Fourier Transform (FFT) algorithm. Then, the transfer function $H_i(\omega)$ is computed as the average of the cross-spectrum of the corresponding voltage and current signals over the averaged current spectrum according to:

$$H_i(\omega) = \frac{\sum_{j=1}^{N_a} V_{ij}(\omega) I_j(\omega)^*}{\sum_{j=1}^{N_a} I_j(\omega) I_j(\omega)^*} \quad \text{(Equation 4)}$$

where:

$V_{ij}(\omega)$ is the Discrete Fourier Transform of the jth block of the sampled waveform corresponding to probe i;

$I_j(\omega)$ is the Discrete Fourier Transform of the jth block of the sampled current waveform; and $N_a$ is the number of blocks to be averaged.

This technique reduces the noise components of the voltage signals that are not correlated to the current signal. In addition, it reduces the variance of the estimate of $H_i(\omega)$. The Discrete Fourier Transforms are computed using the Fast Fourier Transform (FFT) algorithm.

For each transfer function computed above, a coherence function also is computed. The coherence between probe i and the injected current is defined as follows:

$$COH_i(\omega) = \frac{\left| \sum_{j=1}^{N_a} V_{ij}(\omega) I_j(\omega)^* \right|}{\sqrt{\sum_{j=1}^{N_a} |V_{ij}(\omega) I_j(\omega)|^2}} \quad \text{(Equation 5)}$$

The average of the coherence functions (one for each GPD signal) is used as a bad data rejection criterion for the computed ground impedance versus frequency function. Specifically, portions of the impedance versus frequency function are replaced by linear interpolation if this criterion indicates that these portions contain large errors. The criterion is based on the following property of the coherence function: The coherence between two signals is a real function which has a value between zero and one. The value of the coherence is identically equal to one for all frequencies, only if the two signals are perfectly correlated. If one of the two signals contains noise not present in the other, then the value of the coherence function is less than one only at the frequencies which the noise occupies. Thus, if the measured GPD signals contain 60 Hz or harmonic components due to inductive coupling to the probe cables, the coherence function will be lower than one at the corresponding frequencies.

Using the GPD transfer functions $H_i(\omega)$, i=1,2, . . . ,6, the transfer function of the grounding system potential rise with respect to remote earth is computed. This quantity represents the impedance of the grounding system as a function of frequency. For this purpose, a simplified model of the grounding system under test is postulated, and the ground potential rise is estimated with state and parameter estimation methods.

The grounding system under test is modeled as a circular disk on the surface of the earth. The current electrode is represented as a point source on the surface of the earth at a distance $x_O$ from the center the grounding system. According to this model, the voltage on the surface of the earth (with respect to remote earth) at a point P outside the grounding system is:

$$E_i(\omega) = k_e I(\omega) \, (G_{i1}(\omega)/x - G_{i2}(\omega)/y) \quad \text{(Equation 6)}$$

where:

$k_e$ is an unknown constant depending on soil parameters and grounding system topology;

$x_i$ is the distance from the point P to the center of the grounding system;

$y_i$ the distance from the point P to the current electrode, and:

$$G_{i1}(\omega) = e^{-j\omega \tau_{i1}} \left( \frac{1}{1 + j\omega t_{i1}} \right) \quad \text{(Equation 6-1)}$$

where:

$\tau_{i1} = 3x_i/c$ $t_{i1} = 0.3 x_i (1 + x_i^2/90,000) \tau_{i1}$ c speed of light (in m/sec)

$x_1$ is in meters $$G_{i2}(\omega) = e^{-j\omega \tau_{i2}} \left( \frac{1}{1 + j\omega t_{i2}} \right) \quad \text{(Equation 6-2)}$$

$\tau_{i2} = 3y_i/c$ $t_{i2} = 0.3 y_i (1 + y_i/90,000) \tau_{i2}$ where:

$y_i$ is in meters c=speed of light (in m/sec)

The GPD for each probe is expressed as follows:

$$GPD_i(\omega) = GPR(\omega) - E_i(\omega) = Z(\omega) I(\omega) - E_i(\omega) \quad \text{(Equation 7)}$$

Combining the equations of all six voltage probes in vector form yields:

$$\begin{bmatrix} V_1(\omega) \\ V_2(\omega) \\ V_3(\omega) \\ \vdots \\ V_6(\omega) \end{bmatrix} = Z(\omega) I(\omega) \begin{bmatrix} 1 \\ 1 \\ 1 \\ \vdots \\ 1 \end{bmatrix} - k_e I(\omega) \begin{bmatrix} G_{11}(\omega)/x_1 - G_{12}(\omega)/y_1 \\ G_{21}(\omega)/x_2 - G_{22}(\omega)/y_2 \\ G_{31}(\omega)/x_3 - G_{32}(\omega)/y_3 \\ \vdots \\ G_{61}(\omega)/x_6 - G_{62}(\omega)/y_6 \end{bmatrix} \quad \text{(Equation 8)}$$

The above is a linear system of six equations and two unknowns. The unknown quantities are $k_e$ and $Z(\omega)$. Writing the above equations in matrix form yields:

$$\begin{bmatrix} 1 & G_{11}(\omega)/x_1 - G_{12}(\omega)/y_1 \\ 1 & G_{21}(\omega)/x_2 - G_{22}(\omega)/y_2 \\ 1 & G_{31}(\omega)/x_3 - G_{32}(\omega)/y_3 \\ 1 & G_{41}(\omega)/x_4 - G_{42}(\omega)/y_4 \\ 1 & G_{51}(\omega)/x_5 - G_{52}(\omega)/y_5 \\ 1 & G_{61}(\omega)/x_6 - G_{62}(\omega)/y_6 \end{bmatrix} \begin{bmatrix} Z(\omega) \\ k_e \end{bmatrix} = \frac{1}{I(\omega)} \begin{bmatrix} V_1(\omega) \\ V_2(\omega) \\ V_3(\omega) \\ V_4(\omega) \\ V_5(\omega) \\ V_6(\omega) \end{bmatrix} \quad \text{(Equation 9)}$$

The above system of equations is overdetermined, since it contains more equations than unknowns. The solution is obtained using a weighted least squares method In order to simplify notation, Equation 9 is rewritten as:

$$M(\omega) \begin{bmatrix} Z(\omega) \\ k_e \end{bmatrix} = Z_p(\omega) \quad \text{(Equation 10)}$$

where the definition of $M(\omega)$ and $Z_p(\omega)$ is obvious by comparing Equations 9 and 10. The weighted least squares solution is:

$$\begin{bmatrix} Z(\omega) \\ k_e \end{bmatrix} = [M(\omega)^T W M(\omega)]^{-1} M(\omega)^T W Z_p(\omega) \quad \text{(Equation 11)}$$

where: W is a diagonal matrix of dimension 6×6 containing the weight factors.

The above equation yields the solution for $Z(\omega)$ which represents the impedance of the grounding system versus frequency with respect to the remote earth. Some of the above equations include terms having both real and imaginary components, with the imaginary components reflecting the reactance component of the impedance.

Figure 3:
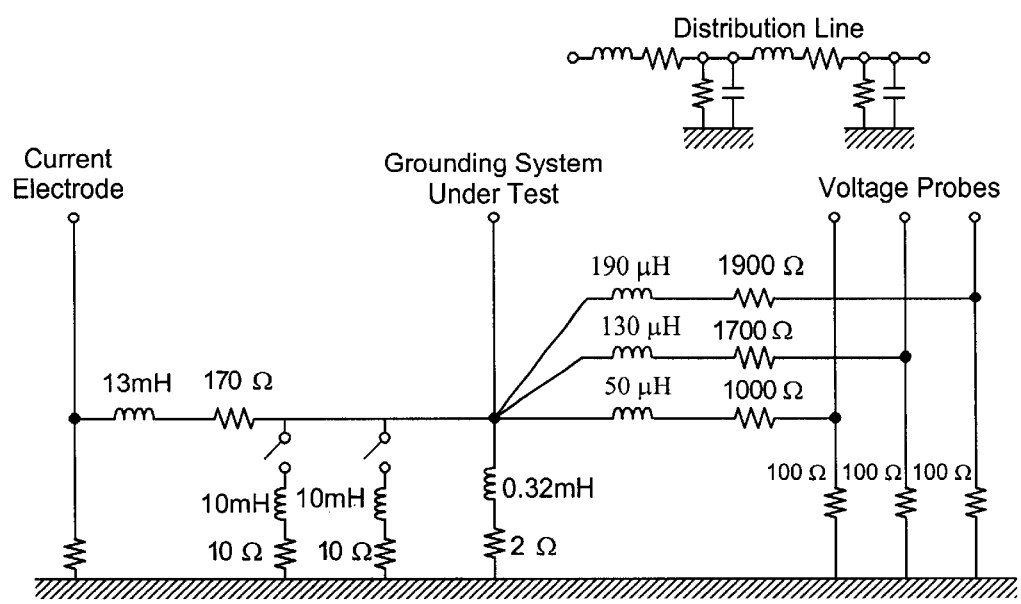
FIG. 3 is a schematic electrical diagram of a scale model of a grounding system used to test the apparatus of FIG. 2.

The apparatus has been developed in a modular way. Specifically, four modules have been developed simultaneously: (1) the current source module, (2) the signal acquisition and control module, (3) the external hardware (cables, probes, etc.), and (4) the software. Because of the complexity of the device, testing and validation of all components and especially of software is of paramount importance. To meet this requirement, a lumped parameter model of a typical substation grounding system has been constructed in the laboratory and such is schematically shown in FIG. 3. This model has been used for testing and validation of the apparatus.

An important aspect of the invention lies in the use of redundancy to improve the accuracy and realibility of the results. One type of redundancy used is in the number and spacing of the voltage probes used. By using a plurality of voltage probes spaced at intervals from the grounding system, the ground potential rise with respect to remote earth can be estimated with greater confidence. For example, if one were to assume that measurements taken at increasing distances from the grounding system would linearly approach the ground potential rise, using several probes, thereby providing several data points to estimate the slope of line, yields a more reliable and accurate answer. The reliability is enhanced because if any one ground potential difference is significantly affected by noise or interference, the other data points can be used to isolate the affected data point as an anomaly. Also, by using six voltage probes, a better approximation of such a linear function is possible. In the preferred manner of carrying out the invention, the ground potential rise is modeled as a hyperbolic function of ground potential difference as a function of distance. The redundancy of the number of probes increases the reliability and accuracy of the ground potential rise so estimated.

The random current frequencies injected at the grounding system result in voltage measurements at those random frequencies. Thus, at each voltage probe a large number of data points is collected. This type of redundancy also helps to better fit the data to the curve and protects against the measurements at one or more of the probes being skewed by interference or noise at or about a specific frequency.

While the invention has been disclosed in preferred forms, it will be obvious to those skilled in the art that many additions, deletions, and modifications can be made therein without departing from the spirit and scope of invention as set forth in the following claims.

What is claimed is:

1. An apparatus for measuring ground impedance to evaluate the performance of a grounding system, said apparatus comprising:

a current electrode for placement in the ground at a first location;

source means for causing an electric current to flow from said current electrode to the grounding system;

means for measuring the current flowing from said current electrode to the grounding system;

at least one voltage probe for placement in the ground at an arbitrary second location spaced a distance from the grounding system, said arbitrary second location being a non-null and non-asymptotic location, said at least one voltage probe having a ground potential resulting from the flow of current from said current electrode to the grounding system;

means for measuring the ground potential difference between a ground potential detected at the grounding system and the ground potential of said at least one voltage probe; and electronic means which utilizes a mathematical model of said grounding system and state and parameter estimation techniques to formulate an estimate of ground potential rise with respect to remote earth and which utilizes the formulated estimate of ground potential rise to estimate the impedance of the grounding system.

2. An apparatus as claimed in claim 1 wherein said at least one voltage probe comprises two voltage probes.

3. An apparatus as claimed in claim 1 wherein said at least one voltage probe comprises three voltage probes.

4. An apparatus as claimed in claim 1 wherein said at least one voltage probe comprises six voltage probes.

5. An apparatus as claimed in claim 3 further comprising a cable assembly for coupling said three voltage probes with said electronic means and first, second, and third coupling means for coupling said three voltage probes to said cable assembly, said coupling means being spaced along said cable assembly at intervals of on the order of hundreds of feet.

* * * * *